(12) United States Patent
Caffee et al.

(10) Patent No.: US 9,000,833 B2
(45) Date of Patent: Apr. 7, 2015

(54) COMPENSATION OF CHANGES IN MEMS CAPACITIVE TRANSDUCTION

(71) Applicant: Silicon Laboratories Inc., Austin, TX (US)

(72) Inventors: Aaron Caffee, Scappoose, OR (US); Emmanuel P. Quevy, El Cerrito, CA (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/786,686

(22) Filed: Mar. 6, 2013

(65) Prior Publication Data

US 2014/0253219 A1 Sep. 11, 2014

(51) Int. Cl.
*H01L 41/00* (2013.01)
*H02N 1/00* (2006.01)
*B81B 7/00* (2006.01)

(52) U.S. Cl.
CPC .............. *H02N 1/006* (2013.01); *B81B 7/0045* (2013.01)

(58) Field of Classification Search
USPC ........................................ 331/50, 57; 327/516
See application file for complete search history.

(56) References Cited

U.S. PATENT DOCUMENTS

| | | | |
|---|---|---|---|
| 6,954,020 B2 | 10/2005 | Ma et al. | |
| 7,854,174 B2 | 12/2010 | Aebersold et al. | |
| 7,982,550 B1 | 7/2011 | Quevy et al. | |
| 2007/0247245 A1* | 10/2007 | Hagelin | 331/154 |
| 2007/0290763 A1* | 12/2007 | Partridge et al. | 331/154 |
| 2008/0007362 A1* | 1/2008 | Partridge et al. | 331/176 |
| 2009/0121808 A1* | 5/2009 | Van Beek et al. | 333/186 |
| 2010/0225483 A1* | 9/2010 | Scheucher et al. | 340/572.3 |
| 2011/0057709 A1* | 3/2011 | Laraia et al. | 327/358 |
| 2012/0043999 A1* | 2/2012 | Quevy et al. | 327/147 |
| 2012/0133448 A1* | 5/2012 | Gregg et al. | 331/116 R |
| 2012/0133848 A1* | 5/2012 | Williamson | 348/836 |
| 2012/0268216 A1* | 10/2012 | Borremans | 331/70 |
| 2012/0274410 A1* | 11/2012 | Koyama | 331/155 |
| 2013/0106497 A1* | 5/2013 | Lutz et al. | 327/525 |

OTHER PUBLICATIONS

Kaajakari, Ville, "MEMS Tutorial: Nonlinearity in Micromechanical Resonators," URL: <http://www.kaajakari.net/~ville/research/tutorials/tutorials.shtml>, downloaded Jan. 25, 2013, 7 pages.

(Continued)

*Primary Examiner* — Brandon S Cole
(74) *Attorney, Agent, or Firm* — Abel Law Group, LLP

(57) ABSTRACT

A method for compensating for strain on a MEMS device includes generating a signal indicative of a strain on the MEMS device in a first mode of operating a system including the MEMS device. The method includes compensating for the strain in a second mode of operating the system based on the signal. Generating the signal may include comparing an indicator of a resonant frequency of the MEMS device to a predetermined resonant frequency of the MEMS device. Generating the signal may include comparing a first output of a strain-sensitive device to a second output of a strain-insensitive device and generating an indicator thereof. Generating the signal may include sensing a first capacitive transduction of strain-sensitive electrodes of the MEMS device in the first mode and generating the signal based thereon. The strain-sensitive electrodes of the MEMS device may be disabled in the second mode.

18 Claims, 10 Drawing Sheets

(56) References Cited

OTHER PUBLICATIONS

Kaajakari, Ville, "Reference Oscillators," Section 21.2 of Practical MEMS, Small Gear Publishing, 2009, pp. 334-339.

U.S. Appl. No. 13/721,642 entitled "MEMS Mass Bias to Track Changes in Bias Conditions and Reduce Effects of Flicker Noise," filed Dec. 20, 2013, naming Manu Seth and Aaron Caffee as inventors.

* cited by examiner

COMPENSATION OF CHANGES IN MEMS CAPACITIVE TRANSDUCTION

BACKGROUND

1. Field of the Invention

The invention is related to microelectromechanical systems (MEMS) devices.

2. Description of the Related Art

In general, a MEMS transducer converts energy between electrostatic and mechanical forms. MEMS transducers may be used as both sensors that convert motion into electrical energy (accelerometers, pressure sensors, etc.) and actuators that convert electrical signals to motion (comb drive, micromirror devices, oscillators). MEMS devices using capacitive transducers are easy to manufacture and result in low noise and low power consumption sensors and/or actuators.

Capacitive sensing is based on detecting a change in capacitance of a capacitor. If a known voltage is applied across the capacitor (e.g., fixed DC bias voltages applied to the mass and electrodes of a MEMS device), changes in current due to capacitive variations will appear in response to motion of one plate of the capacitor relative to another plate of the capacitor. Similarly, capacitive actuation is based on variation in capacitance of the MEMS device. For example, a DC operating point is established by applying a DC bias voltage across the capacitor and an AC signal changes the capacitance causing changes in force on a plate of the capacitor. Transduction of a MEMS device is based on the voltage difference across the transduction gap (i.e., the voltage difference between the mass and the electrode). However, the transduction gap may vary as a function of environmental factors (e.g., temperature, strain, and aging), thereby changing the capacitance with respect to time, which may affect the spring constant (i.e., spring stiffness) associated with a MEMS device, which is typically modeled as a mass-spring damper system. In general, a change in the electrode capacitance affects the equivalent spring stiffness through electrostatic pulling, which affects the resonant frequency of the MEMS device. MEMS devices targeting applications requiring high-precision (e.g., resonators having resonant frequency specifications required to be within +/−10 parts-per-million (ppm)) may not achieve the target specification due to effects of environmental factors on the resonant frequency.

Accordingly, techniques for reducing or eliminating effects of strain on a MEMS device are desired.

SUMMARY OF EMBODIMENTS OF THE INVENTION

In at least one embodiment of the invention, a method of compensating for strain on a MEMS device includes generating a signal indicative of a strain on the MEMS device in a first mode of operating a system including the MEMS device. The method includes compensating for the strain in a second mode of operating the system based on the signal. Generating the signal may include comparing an indicator of a resonant frequency of the MEMS device to a predetermined resonant frequency of the MEMS device. Generating the signal may include comparing a first output of a strain-sensitive device to a second output of a strain-insensitive device and generating an indicator thereof. The strain-sensitive device and the strain-insensitive device both may be capacitors, transistors, diffusion resistors, or polysilicon resistors. Generating the signal may include comparing a first output of the MEMS device configured to use strain-sensitive electrodes to a second output of the MEMS device configured to use less strain-sensitive electrodes and generating an indicator thereof. Generating the signal may include sensing a first capacitive transduction of strain-sensitive electrodes of the MEMS device in the first mode of operating the system and generating the signal based thereon. The method may include disabling the strain-sensitive electrodes of the MEMS device in the second mode of operating the system and operating the system in the second mode using second electrodes of the MEMS device, the second electrodes being less sensitive to strain that the first electrodes.

In at least one embodiment of the invention, an integrated circuit includes a MEMS device, a strain sensor configured to generate a signal indicative of a strain on the MEMS device in a first mode of operation of the integrated circuit, and a control circuit configured to provide a strain-compensating signal based on the signal in a second mode of operation of the integrated circuit. The integrated circuit may include a bias generator configured to generate the strain-compensating signal based on a target bias voltage and a compensation signal based on the signal. The strain-compensating signal may be a bias voltage of the MEMS device. The strain sensor may include a strain-insensitive capacitor and the strain sensor may be configured to compare a capacitance of the strain-insensitive capacitor to a transduction capacitance of the MEMS device. The MEMS device may include first structures configured to operate as first plates of capacitive electrodes in the first mode of operation and configured to be inoperable in the second mode of operation, a resonance mode of the MEMS device having a first strain sensitivity in the first mode of operation. The MEMS device may include second structures configured to operate as the first plates of the capacitive electrodes coupled to the strain sensor in the second mode of operation and configured to be inoperable in the first mode of operation, the resonance mode of the MEMS device having a second strain-sensitivity in the second mode of operation. The first strain sensitivity is less than the second strain sensitivity. The integrated circuit may include signal processing logic configured to generate an output signal based on a resonant frequency of the MEMS device and the strain-compensating signal is provided to the signal processing logic to compensate the output signal for a change to a resonant frequency of the MEMS device based on the strain on the MEMS device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1A:
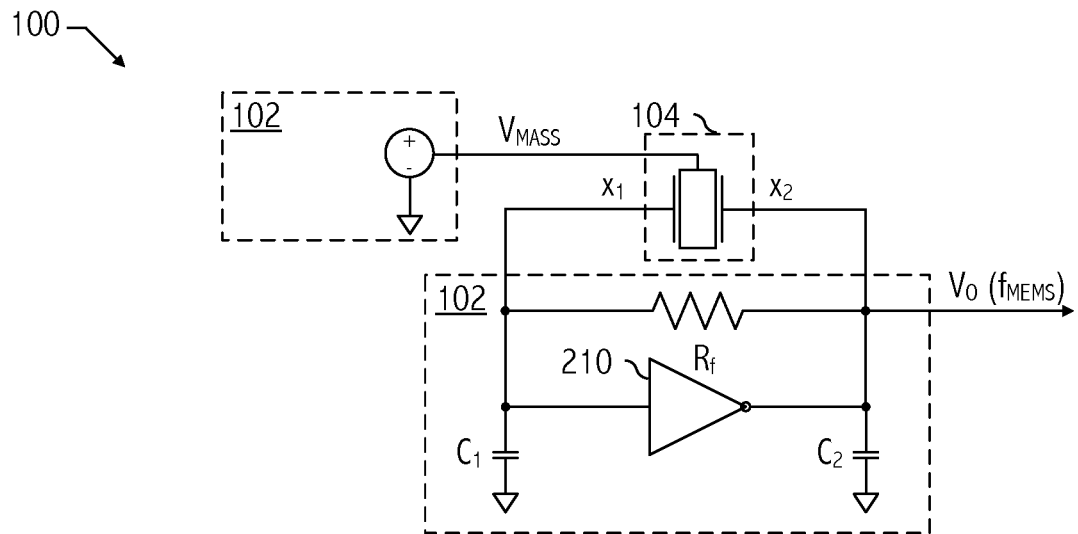
FIG. 1A illustrates a circuit diagram of a MEMS device configured as an oscillator.

Referring to FIG. 1A, in an exemplary MEMS application, MEMS device 104 is coupled to amplifier 210 in an oscillator configuration. Sense electrode $x_1$ generates a signal based on energy transfer from a vibrating mass of MEMS device 104, thereby converting mechanical energy into an electrical signal. In general, bias signals added at various points of a circuit determine an operating point of the circuit and may be predetermined, fixed DC voltages or currents added to AC signals. MEMS device 104 is receives a mass-to-electrode bias voltage, which may be established by applying voltages to the mass and/or electrode. For example, the mass of MEMS device 104 receives a DC bias voltage, $V_{MASS}$, which is generated by a precision voltage reference or voltage regulator of bias generator 102. In other embodiments of a MEMS system, an electrode receives a suitable DC bias voltage and the mass is coupled to a ground voltage or the both the electrode and the mass receive DC bias voltages that result in the target mass-to-electrode bias voltage. A large feedback resistor ($R_F$) biases amplifier 210 in a linear region of operation, thereby causing amplifier 210 to operate as a high-gain inverting amplifier. MEMS oscillator 100 sustains vibrations of MEMS device 104 by feeding back the output of amplifier 210 to a drive electrode of MEMS device 104. Amplifier 210 receives a small-signal voltage from sense electrode $x_1$ and generates a voltage on drive electrode $x_2$ that causes the mass of MEMS device 104 to continue to vibrate. MEMS device 104 in combination with capacitances $C_1$ and $C_2$ form a pi-network bandpass filter that provides 180 degrees of phase shift and a voltage gain from drive electrode $x_2$ to sense electrode $x_1$ at approximately the resonant frequency of MEMS device 104.

An exemplary MEMS device 104 is formed using a substrate, which may include a CMOS integrated circuit. MEMS device 104 may be any device that falls within the scope of MEMS technologies. For example, MEMS device 104 may be any mechanical and electronic structure fabricated using the substrate using lithography, deposition, and etching processes. MEMS device 104 may be a device such as, but not limited to, a resonator (e.g., an oscillator), a temperature sensor, a pressure sensor or an inertial sensor (e.g., an accelerometer or a gyroscope). MEMS device 104 may have a portion suspended from the substrate (e.g., a suspended mass, body, or resonator) attached to the substrate by an anchor. For example, the suspended mass of MEMS device 104 is a feature such as, but not limited to, a beam, a plate, a cantilever arm or a tuning fork. In a specific embodiment, MEMS device 104 includes a resonating feature (e.g., suspended mass) flanked by one or more drive electrodes and one or more sense electrodes.

Parameters of a MEMS device may vary as a function of environmental factors (e.g., temperature, strain, aging, etc.) that cause electrical nonlinearities, thereby changing the resonant frequency or other operational characteristics of the MEMS device. For example, the resonant frequency of a MEMS device using a capacitive transduction is based on the geometry of capacitive transducers (e.g., dimensions of a gap between capacitive plates). Soldering the substrate to a second substrate (e.g., a printed circuit board) causes stress on the substrate of the MEMS device. Stress on a substrate of a MEMS device causes strain on the MEMS device. Strain can change over time, resulting in a perceived aging of the part. In addition, strain can change over temperature, resulting in a perceived temperature instability. Although a resulting parameter shift may have an expected value, it can be unpredictable. In general, strain is a change in element length ΔL over the original element unit length L (e.g., S=ΔL/L). Strain affects dimensions of a transduction gap of a parallel plate capacitor. Strain on the MEMS device may cause spring softening that reduces the resonant frequency of the MEMS device. Although the absolute change in dimensions of the resonator is the same for low frequency MEMS resonators and high frequency MEMS resonators, the effect of that change can substantially shift the resonant frequency of low frequency MEMS resonators but cause only a subtle change in resonant frequency for high frequency resonators. This is primarily due to higher frequency resonators having higher spring stiffness for a given area, while low-frequency resonators have low spring stiffness. That is, the higher the spring stiffness, the less sensitive the resonator is to strain. Thus, the effects of strain pose a greater challenge for high-precision, low-frequency resonators. In sensor applications of MEMS devices (e.g., inertial sensors or pressure sensors), strain instability can cause offset variation over time, which affects the achievable resolution of a sensor.

Figure 1C:
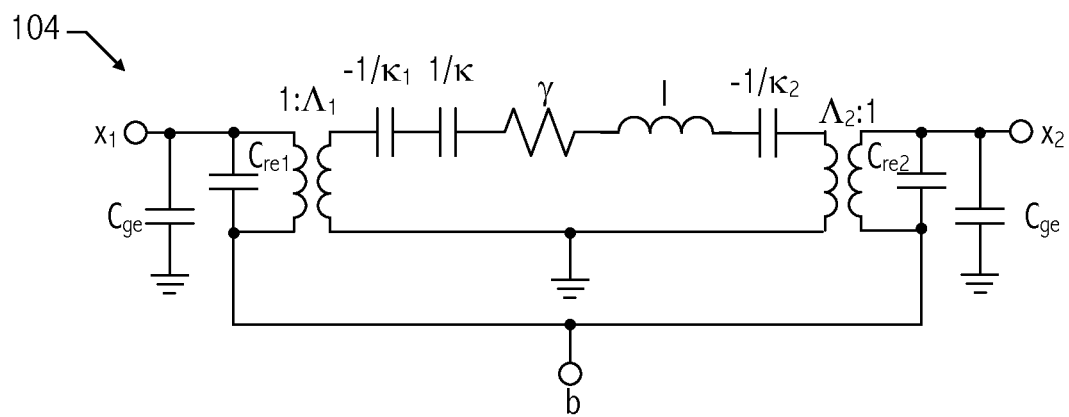
FIG. 1C illustrates an equivalent small signal circuit of the exemplary torsional MEMS device of FIG. 1B.
Figure 1B:
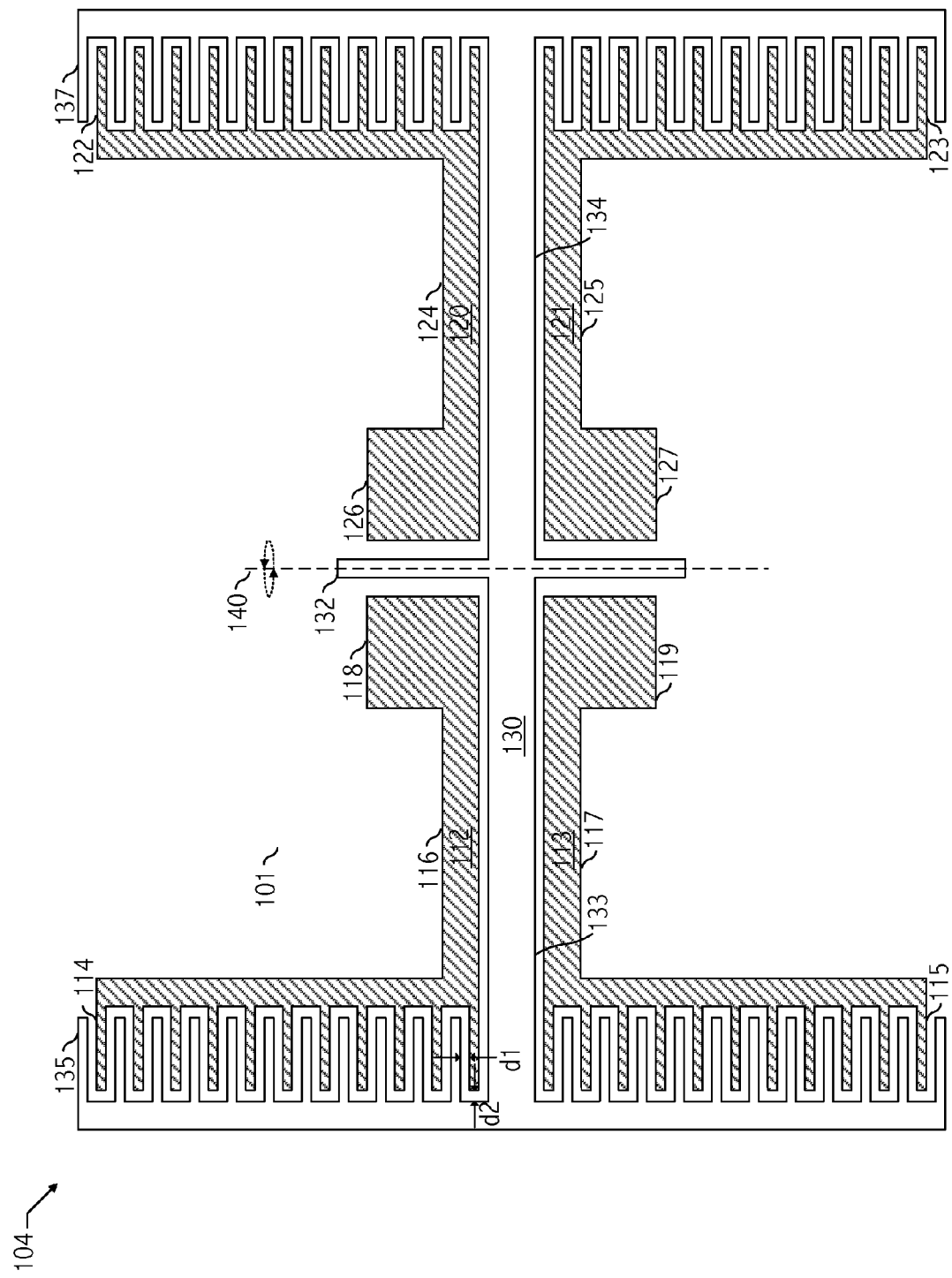
FIG. 1B illustrates a plan view of an exemplary torsional MEMS device.

Referring to FIG. 1B, an exemplary MEMS device 104 includes a first electrode formed from electrode portion 112 and electrode portion 113. A second electrode is formed from electrode portion 120 and electrode portion 121. Resonator 130 (i.e., mass 130 or body 130) is capacitively coupled to the first and second electrodes by interdigitated capacitive fingers. In at least one embodiment of MEMS device 104, electrode portions 112 and 113 are electrically coupled to each other (e.g., in another integrated circuit layer of the device, not shown) and electrode portions 120 and 121 are electrically coupled to each other. In the exemplary MEMS device, electrode portions 112, 113, 120, and 121 include suspended capacitive fingers 114, 115, 122, and 123, respectively, attached to suspended beams 116, 117, 124, and 125, respectively, and are attached to substrate 101 by anchors 118, 119, 126, and 127, respectively. Resonator 130 includes central beam 132 (which may be anchored to the substrate at its tips), suspended beams 133 and 134, and suspended capacitive fingers 135 and 137. In a torsional mode of operation, resonator 130 displaces about axis 140 in a seesaw-like motion. During operation, central beam 132 undergoes a torsional deformation causing it to twist clockwise or counterclockwise about axis 140 between the anchors as suspended capacitive fingers 135 and 137 dynamically deflect in response to an out-of-plane electrostatic force imparted on the associated transducers when either or both are driven with an AC signal. However, note that in other modes of operation, suspended capacitive fingers may displace in the same direction with respect to substrate 101, i.e., capacitive fingers 135 and 137 may both move towards or away from substrate 101, twisting in opposite directions about axis 140.

Ideally, to reduce the effects of strain on MEMS device 104, electrode anchors and resonator anchors are collocated. Since locating the electrode anchors and resonator anchors in the same location on a substrate is not typically feasible, the electrode and resonator anchors of MEMS device 104 are located in close proximity (e.g., as close as allowable by the design rules for the target manufacturing process) to reduce sensitivity of MEMS device 104 to the effects of strain on MEMS device 104. Transduction of MEMS device 104 is based on the voltage difference across the transduction gap (i.e., the voltage difference between the mass and the electrode, $V_{ME}$). For example, the transduction gap of MEMS device 104 is defined by the distances between the capacitive fingers of the resonator and corresponding capacitive fingers of an electrode, distances d1 and d2, which may be equal. Those distances may vary as a function of strain, causing a change to the capacitive transduction of MEMS device 104 and thus causing a change to the resonant frequency.

Referring to FIG. 1C, MEMS device 104 may be modeled as a spring-mass system having a resonant frequency of $$f_0 = \frac{1}{2\pi}\sqrt{\frac{\kappa}{I}},$$

where $\kappa$ is a constant indicative of the angular spring stiffness, I is angular mass, and $f_0$ is the resonant frequency. A stress on MEMS device 104 causes a proportional deformation of MEMS device 104 (i.e., strain) on that device, which results in a change in the spring stiffness, $\Delta\kappa$.

Figure 2:
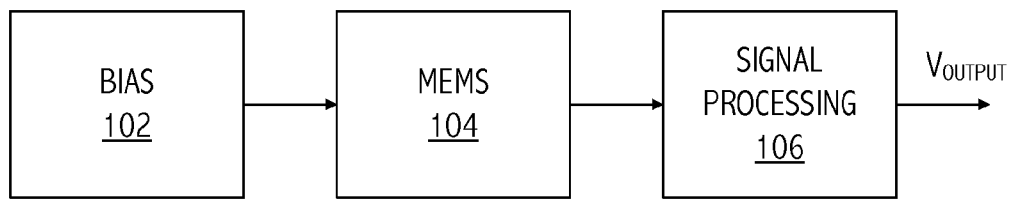
FIG. 2 illustrates a functional block diagram of a typical MEMS system.
Figure 3:
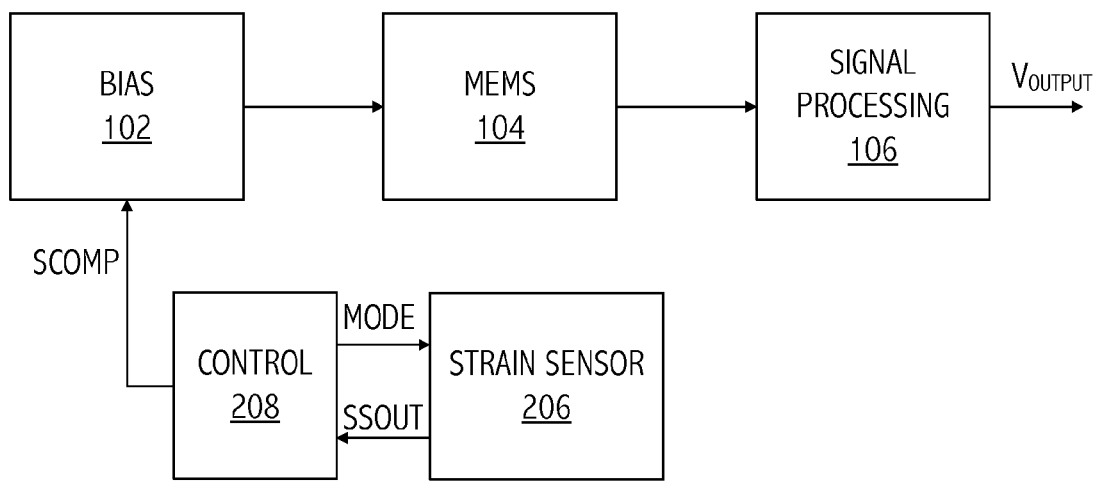
FIG. 3 illustrates a functional block diagram of a MEMS system including strain compensation using an indirect strain sensing technique and compensation applied using a bias signal of the MEMS device consistent with at least one embodiment of the invention.
Figure 4:
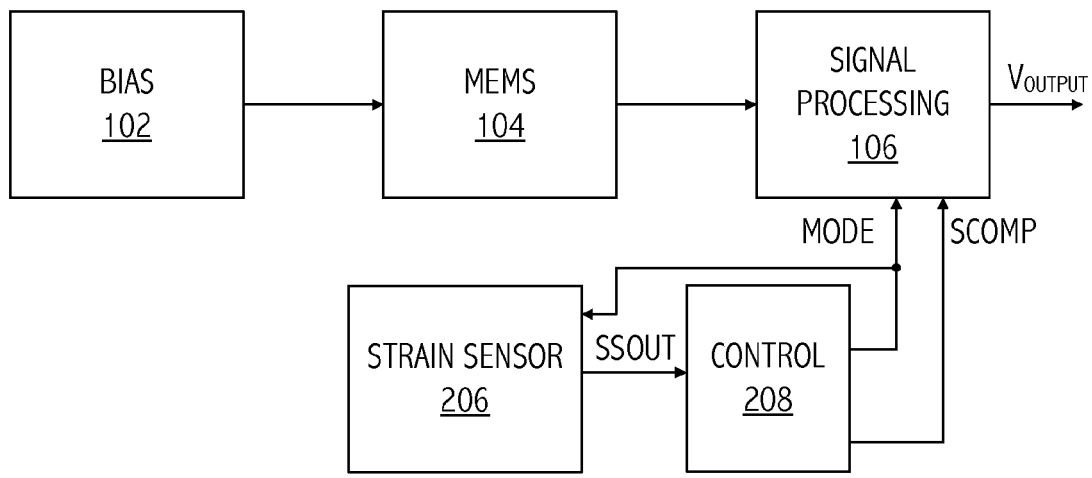
FIG. 4 illustrates a functional block diagram of a MEMS system including strain compensation using an indirect strain sensing technique and compensation applied in the signal processing of an output of the MEMS device consistent with at least one embodiment of the invention.
Figure 5:
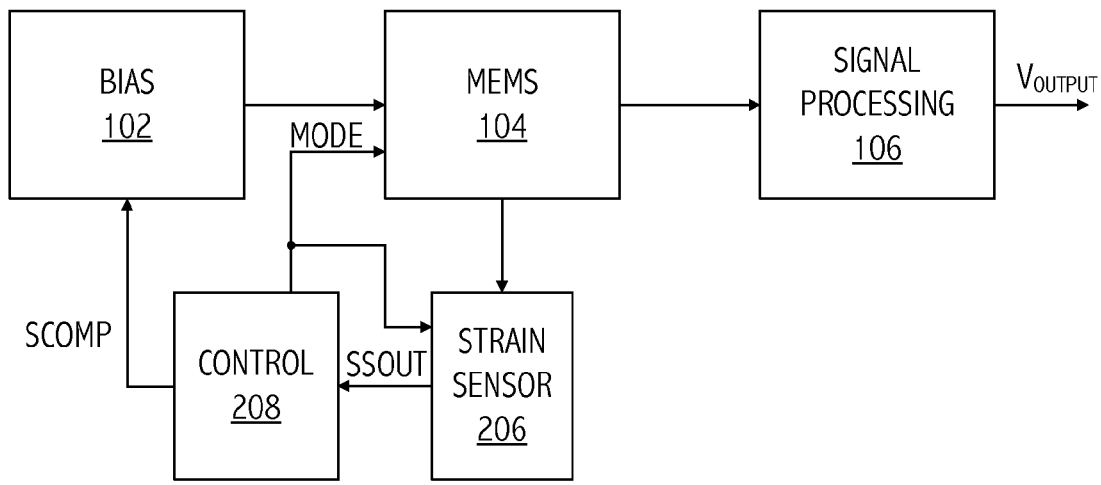
FIG. 5 illustrates a functional block diagram of a MEMS system including strain compensation using a direct strain sensing technique and compensation applied using a bias signal of the MEMS device consistent with at least one embodiment of the invention.
Figure 6:
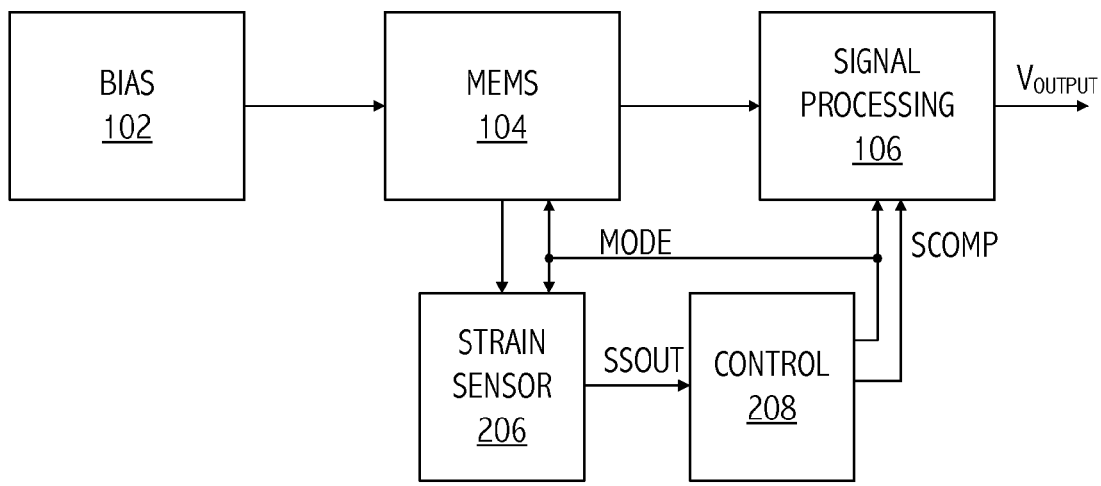
FIG. 6 illustrates a functional block diagram of a MEMS system including strain compensation using a direct strain sensing technique and compensation applied in the signal processing of an output of the MEMS device consistent with at least one embodiment of the invention.
Figure 7A:
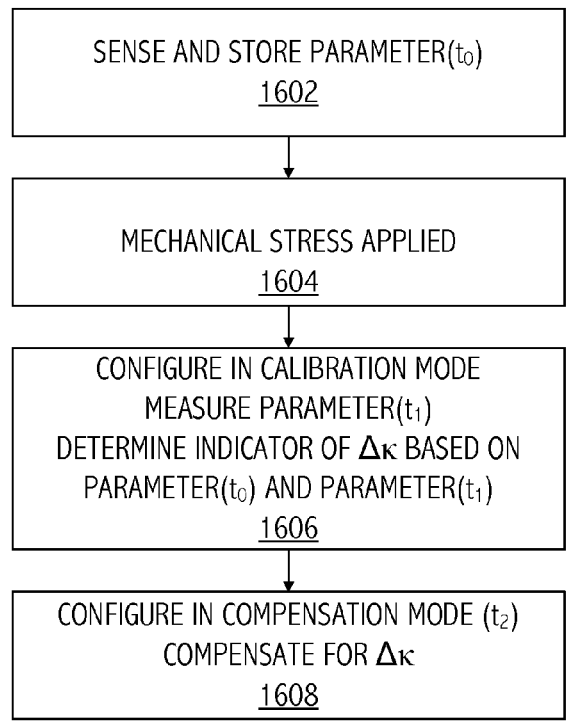
FIGS. 7A and 7B illustrate information and control flows for techniques for detecting and compensating for resonant frequency shift of a MEMS device resulting from strain generated by mechanical stress applied to a MEMS device consistent with at least one embodiment of the invention.
Figure 7B:
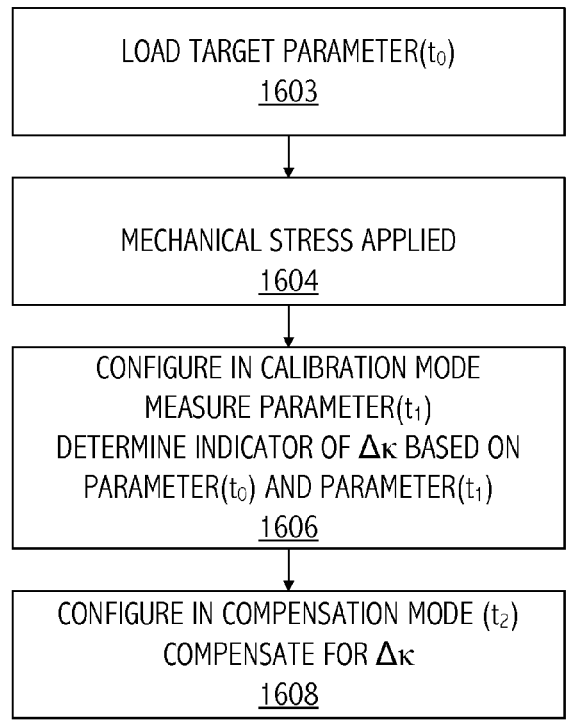

For an exemplary torsional oscillator of FIGS. 1B and 1C, the change in the spring stiffness may be modeled as:

$$\Delta\kappa = \Lambda_1\Lambda_2\left(\frac{1}{C_{re1} + C_{ge1} + C_{amp1}} + \frac{1}{C_{re2} + C_{ge2} + C_{amp2}} - \frac{1}{C'_{re1}} - \frac{1}{C'_{re2}}\right)$$

where $C_{re1}$ is the capacitance between the resonator and a first electrode of the MEMS device, $C_{re2}$ is the capacitance between the resonator and a second electrode of the MEMS device, $C_{ge1}$ is a capacitance between the first electrode and ground, $C_{ge2}$ is a capacitance between the second electrode and ground, $C_{amp1}$ is a capacitance due to loading of the amplifier at the first electrode, $C_{amp2}$ is a capacitance due to loading of the amplifier at the second electrode, $C'_{re1}$ is the capacitance between resonator 130 and the first electrode resulting from the strain on the MEMS device, $C'_{re2}$ is the capacitance between resonator 130 and the second electrode resulting from the strain on the MEMS device, $$\Lambda = V_{re}\left(\frac{\partial C_{re}}{\partial z}\frac{dz}{d\theta} + \frac{\partial C_{re}}{\partial x}\frac{dx}{d\theta}\right) \approx \frac{V_{re}r_{eq}\alpha_v C_{re}}{g_0},$$

where $g_0$ accounts for geometric dependence of capacitance, $\alpha_v$ accounts for distributed velocity field, and $r_{eq}$ is the equivalent radius of the angular mass, $$I = \sum_{i=1}^{N} m_i r_i^2$$

where r is radius and m is mass). Note that $C_{ge1}$ and $C_{ge2}$ depend on $C_{re1}$ and $C_{re2}$. Accordingly, the resonant frequency changes to $$f'_0 = \frac{1}{2\pi}\sqrt{\frac{\kappa + \Delta\kappa}{I}}$$

in response to strain. Referring to FIG. 2, in a typical MEMS system, MEMS device 104 may be configured using bias generator 102 and signal processing module 106 for particular application (e.g., as a sensor or actuator). Referring to FIGS. 3-6, techniques for in situ sensing of strain and compensation of changes in capacitive transduction of MEMS device 104 resulting from the strain include applying an electrical strain compensation signal to the MEMS system based on a signal indicative of a sensed strain on the MEMS device. In some embodiments of a MEMS system, the MEMS device itself receives the electrical strain compensating signal. Referring to FIGS. 3 and 5, for example, MEMS bias generator 102 adjusts one or more bias signals that are applied directly to the MEMS device based on a strain compensation signal provided by control module 208 that is generated based on a signal indicative of the strain. In other embodiments of a MEMS system, an electrical strain compensation signal indirectly compensates for strain on the MEMS device by electrically compensating an output of the MEMS device or other signal generated based on the output of the MEMS device. For example, signal processing module 106, which is driven by the output of MEMS device 104, receives a strain compensation signal and adjusts the output signal $V_{OUTPUT}$ based thereon, as illustrated in FIGS. 4 and 6. The strain compensation signal may be generated based on a signal indicative of the strain on the MEMS device, which may be determined directly from MEMS device 104 by strain sensor 206, as illustrated in FIGS. 5 and 6, or indirectly determined by strain sensor 206 by sensing a strain on structures other than MEMS device 104, as illustrated in FIGS. 3 and 4. In addition, note that other embodiments of a MEMS system combine features of the MEMS systems of FIGS. 3-6 to use both direct and indirect sensing of strain on the MEMS device and/or compensation both to the MEMS device and the signal processing module.

Referring back to FIGS. 3-6, control module 208 may configure one or more elements of the MEMS system in various modes of operation, e.g., a characterization mode before attaching the MEMS device to a substrate, a calibration mode after attaching the MEMS device to a substrate, and a compensation or normal operating mode. During a calibration mode of operation, $t_0$, strain sensor 206 senses a strain on the MEMS device. That sensed strain or other indicator of an amount of strain compensation to be applied to MEMS device 104 may be stored for later use in another mode. Control module 208 may then configure the MEMS system in a normal operating mode that uses the predetermined strain value or predetermined strain compensation value to compensate for the strain on MEMS device 104.

For example, referring to FIGS. 3-6, and 7A, during the characterization mode ($t_0$), test equipment interacts with MEMS device 104 using any suitable integrated circuit interface (e.g., one or more pins of a serial or parallel chip interface) and configures MEMS device 104 in a resonator configuration. The test equipment measures a parameter indicative of the capacitive transduction of MEMS device 104 (e.g., the mass-electrode capacitance, $C_{ME}$, the frequency of $V_{OUTPUT}$, or other suitable parameter). That measurement may be stored in memory of the integrated circuit for later use (1602). However, if the measured parameter is within a target range (e.g., the frequency of $V_{OUTPUT}$ is within a target resonant frequency range), which is loaded into a storage device of the integrated circuit (1603), MEMS device 104 is merely flagged for meeting that specification. When the integrated circuit including MEMS device 104 is exposed to mechanical stress (1604), stresses on the substrate may cause a strain, $\Delta\kappa$, on MEMS device 104. Control module 208 then configures the MEMS system in a calibration mode ($t_1$) to sense a present value of the parameter. Control module 208 determines an indication of $\Delta\kappa$ based on the predetermined stored value of the parameter (parameter($t_0$)) and the present value of the parameter (parameter($t_1$)) (1606). Control module 208 then configures the MEMS system to compensate for the strain in a normal operating mode (compensation mode ($t_2$)) based on the indication of $\Delta\kappa$ and a predetermined relationship between $\Delta\kappa$ and a particular compensation signal (1608). For example, the particular compensation signal may be generated by applying a gain or attenuation factor to the signal indicative of strain or by applying another suitable function to the signal to correlate a compensation signal to a change in resonant frequency resulting from the strain.

In other embodiments of the MEMS system, additional measurements of the parameter are made and stored for later use and/or applied during system operation. For example, the parameter may be measured during a wafer-level probe test (prior to $t_0$), the parameter may be measured after packaging (prior to $t_1$), and/or the parameter may be measured after board assembly ($t_1$). Those measurements may be used by control module 208 to generate a compensation signal during compensation mode ($t_2$). Such techniques may reduce testing costs, and allow a MEMS manufacturer to deliver calibrated frequency sources in die format. In addition, control module 208 may repeat parameter measurement periodically during compensation mode (during $t_2$) and update the compensation signal accordingly. By measuring the parameter during compensation mode and updating the compensation signal, the system compensates for changes in the parameter due to aging (e.g., relaxation of a MEMS package after being attached to a printed circuit board).

Figure 8:
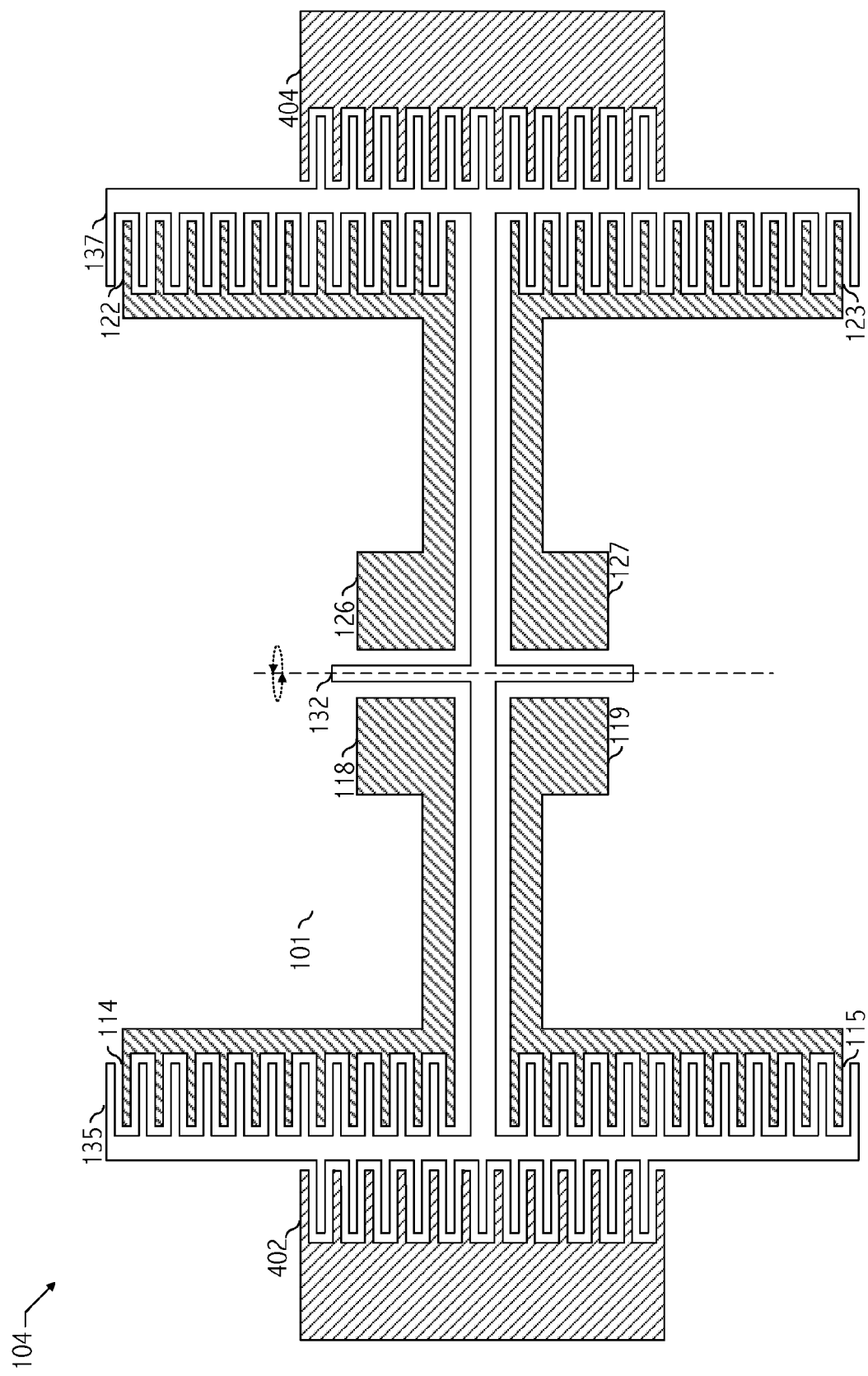
FIG. 8 illustrates a functional block diagram of a MEMS structure for detecting changes in capacitive transduction as a result of strain on the MEMS device consistent with at least one embodiment of the invention.

Referring back to FIGS. 3-6, strain sensor 206 may sense the strain on MEMS device 104 using any of several different techniques. Referring to FIG. 8, in at least one embodiment, strain sensor 206 includes one or more alternate MEMS electrodes. As described above, typical MEMS electrodes are anchored to substrate 101 at locations that reduce strain sensitivity of the device. For example, anchors 118, 119, 126, and 127, which are used in the normal operation of MEMS 104, are located as close as possible to anchor(s) of central beam 132 to reduce strain sensitivity. However, to increase the precision of the strain measurement, alternate electrodes 402 and 404 are formed in locations that increase the strain sensitivity of the MEMS device, e.g., at the farthest point from anchor(s) of central beam 132, and otherwise have the same electrical characteristics of the electrode including suspended capacitive fingers 114 and 115 and the electrode including suspended capacitive fingers 122 and 123, respectively, in the absence of strain on MEMS device 104. That is, alternate electrodes 402 and 404 are characterized by the same capacitive transduction gap in the absence of strain on MEMS device 104 by the electrode including suspended capacitive fingers 114 and 115 and the electrode including suspended capacitive fingers 122 and 123. Alternate electrodes 402 and 404 are used in the calibration mode discussed above and in that mode receive the same bias voltage as the electrode including suspended capacitive fingers 114 and 115 and the electrode including suspended capacitive fingers 122 and 123 in the normal operating mode. Alternate electrodes 402 and 404 may be included in the strain sensors of FIGS. 5 and 6 for directly measuring the strain on MEMS device 104. In the normal mode of operation, alternate electrodes 402 and 404 are disabled, e.g., they are coupled to the same power plane as the resonator portion. Alternate electrodes 402 and 404 effectively apply a gain factor to the strain measurement increasing the resolution of the sensing technique. The ratio of strain sensitivity of the alternate electrodes to the less strain sensitive electrodes is used to generate a strain compensation signal for the MEMS device to use in normal mode.

Referring to FIGS. 5, 6, and 8, in at least one embodiment, a MEMS system determines variation of a parameter (e.g., resonant frequency variation) with respect to strain based on a differential measurement of the parameter with respect to strain. For example, control 208 configures MEMS device 104 as a resonator using the electrode including suspended capacitive fingers 114 and 115 and the electrode including suspended capacitive fingers 122 and 123, and measures and stores a first indicator of the MEMS resonant frequency. Then, control 208 configures MEMS device 104 as a resonator using alternate electrodes 402 and 404 and measures and stores a second indicator of the resonant frequency. Control 208 uses the first and second indicators of resonant frequency along with the ratio of strain sensitivity of the alternate electrodes to the less strain sensitive electrodes to generate a differential measurement of frequency variation with respect to strain only. Control 208 then uses that differential measurement to reduce or eliminate any impact of other environmental factors on the strain measurement and compensation signal. In addition, note that in other embodiments, rather than measuring and/or adjusting the resonant frequency of a MEMS device, other parameters may be measured and/or adjusted. For example, techniques described herein may be applied to offset cancellation in inertial sensors by measuring a capacitive modulation voltage, or other suitable sensor output, using a first measurement made using first electrodes and a second measurement made using second electrodes that are more strain-sensitive than the first electrodes.

Regardless of which parameter is being measured, it is generally the same as the parameter that is being compensated for strain sensitivity, but with an amplification or scale factor (e.g., ratio of strain sensitivity of the different sets of electrodes). The scale factor may be determined prior to assembly on a product board (e.g., by applying thermal stress through integrated heaters on the package of the MEMS device or other suitable technique) and then stored in memory in the integrated circuit of the MEMS device and used to compensate for subtle variations of the target parameter. Note that the lower the strain sensitivity of the parameter and the greater the scale factor, the less sensitive the compensation technique is to process variations or tolerances of the scale factor. The scale factor may also be determined as the MEMS device or packaged MEMS device is exposed to strain variations. For example, by comparing the parameter measured during a first mode of operating the MEMS device and the parameter measured during a second mode of operating the MEMS device to the parameter measurements during those modes of operation for a known, stable reference, e.g., another oscillator that is known to be stable, the differential measurements can be interpolated to determine the scale factor, which is used to generate compensation signals.

In at least one embodiment of a MEMS system, the strain compensation is an integrative correction based on measurements that are accumulated over time (e.g., during $t_0$). The compensation signal is applied only at fixed intervals by computing strain variations over time using the known scale factor to extract accumulated error and correct it as a lumped offset. Such embodiment may be useful in applications where instantaneous accuracy is not needed (e.g., real time clock of a watch), but accumulated error over time needs to be minimized.

In at least one embodiment, strain sensor 206 includes a strain insensitive capacitor and compares the capacitance between the resonator and electrode, $C_{ME}$, of MEMS device 104, to the capacitance of the strain insensitive capacitor and provides a voltage to control module 208, which generates a compensation voltage, $V_{SCOMP}$ based on the comparison. For example, referring to FIG. 9, in calibration mode, i.e., $t_1$, the capacitor between the MEMS resonator and an electrode, $C_{RE}$, receives a first voltage, i.e., $\alpha V_{ME}$, and the strain-insensitive capacitor is coupled to ground. Accordingly, node 902 will charge to the voltage $\alpha V_{ME} \times C_{ME}/(C_{ME}+C_1)$, which equals $\alpha V_{ME}/2$, when there is no strain (i.e., $C_1=C_{ME}$), where a is a scaling factor. In calibration mode, capacitor $C_2$ is bypassed, device 309 is diode-coupled, and current source 307 charges the gate-to-source capacitance of device 309 to $V_{GS}$. Device 309 is configured to provide flicker compensation on the input of the charge pump in normal operation. Techniques for reducing flicker noise are described in U.S. patent application Ser. No. 13/721,642 entitled "MEMS Mass Bias to Track Changes in Bias Conditions and Reduce Effects of Flicker Noise," filed Dec. 20, 2013, naming Manu Seth and Aaron Caffee as inventors, which application is incorporated by reference herein.

In normal operation, i.e., $t_2$, node 309, which was precharged to $V_{GS}+\alpha V_{ME} \times C_{ME}/(C_{ME}+C_1)$, is additionally charged or discharged by an amount equal to the difference between $C_{ME}$ and $C_1$ (assuming $C_1=C_2$). Thus the output node has a voltage of:

$$V_{SCOMP}(t_2) = V_{GS} \pm \frac{\alpha V_{ME}(C_{ME} - C_1)}{C_2}.$$

Since $C_1$ and $C_2$ have stress-invariant values matched to $C_{ME}$, then $$V_{SCOMP}(t_2) \approx V_{GS} \pm \alpha V_{ME}\left(\frac{\Delta C_{ME}}{C_{ME}}\right).$$

Note that although the capacitors $C_1$ and $C_2$ may be designed to have the same capacitance as $C_{ME}$, in other embodiments, due to headroom constraints on $C_2$, $C_2$ has a predetermined value greater than $C_{ME}$. Strain sensor 206 and control module 208 may include provisions for trimming $C_1$ and $C_2$ to match or have a predetermined relationship to $C_{ME}$. For example, non-volatile memory bits may be included to selectively enable one or more additional capacitances of $C_1$ and/or $C_2$ to match $C_{RE}$. Gain scaling features may include inversion of the control signal phases $t_1$ and $t_2$ to change the sign of the output signal and input voltage scaling for magnitude by using least-significant bits for α. Note that the circuit structure of strain sensor 206 and control module 208 of FIG. 9 is exemplary only and various other circuit configurations may be used to detect the change in capacitive transduction of MEMS device 104 and generate a corresponding strain compensating signal.

Figure 9:
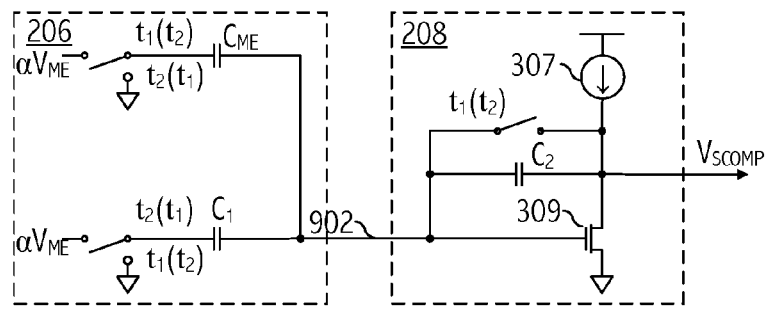
FIG. 9 illustrates a circuit diagram of an exemplary strain sensor and control circuit of FIGS. 3 and 4 consistent with at least one embodiment of the invention.

In at least one embodiment, rather than using actual or strain-sensitive electrodes of the MEMS device having a capacitance $C_{ME}$, a separate strain-sensitive capacitor formed in the integrated circuit substrate and having a capacitance of $C_{ME}$ may be used along with strain insensitive capacitors $C_1$ and $C_2$ of the strain sensor 206 and control module 208 of FIG. 9. In at least one embodiment, rather than using strain sensitive capacitors and strain insensitive capacitors $C_1$ and $C_2$, the strain sensor 206 and control module 208 of FIG. 9 may be adapted for a strain sensitive resistor or transistor and strain insensitive resistors o transistors, respectively, formed on the substrate. Alternate embodiments of control module 208 may exclude the flicker compensation features (e.g., current source 307 and device 309) and generate an output signal $V_{SCOMP}$ of $$V_{SCOMP}(\phi_2) = \pm \frac{\alpha V_{RE}(C_{RE} - C_1)}{C_2} \approx \pm \alpha V_{RE}\left(\frac{\Delta C_{RE}}{C_{RE}}\right).$$

The compensation signal is provided to signal processing module 106, which applies strain compensation to the MEMS system. In yet another embodiment, strain sensor 206 of FIG. 9 may be adapted for comparing the $C_{RE}$ of MEMS device 104 to $C_{RE2}$ of a separate MEMS device formed on the same substrate.

Figure 10:
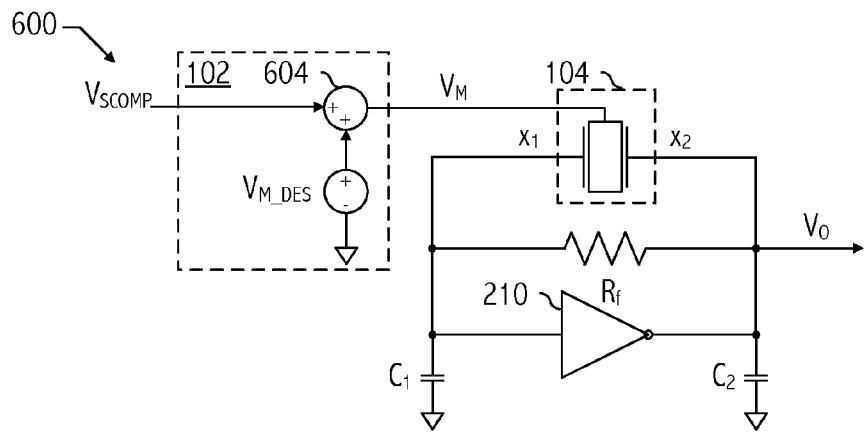
FIG. 10 illustrates a circuit diagram of an exemplary MEMS oscillator responsive to a strain-compensating bias signal of FIGS. 3 and 5 consistent with at least one embodiment of the invention.
Figure 11:
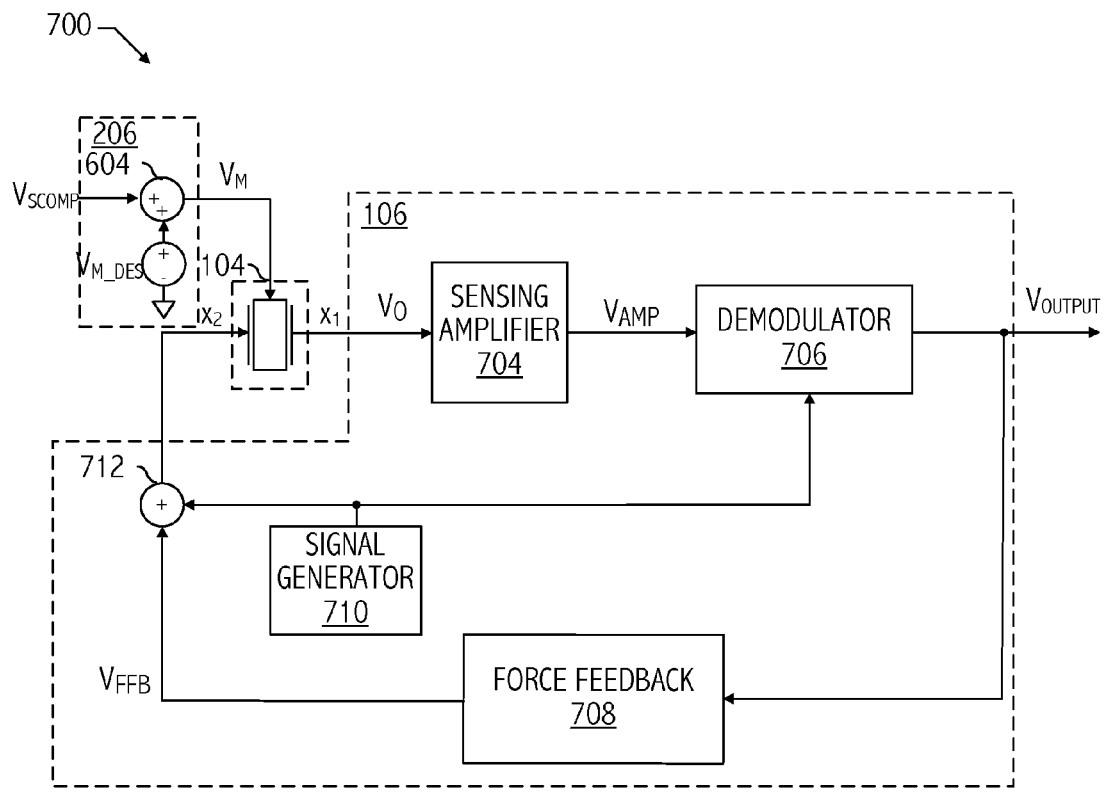
FIG. 11 illustrates a circuit diagram of an exemplary MEMS sensor responsive to a strain-compensating bias signal consistent with at least one embodiment of the invention.

Referring back to FIGS. 3 and 5, control module 208 may provide an output signal, $V_{SCOMP}$, which may be generated using techniques described above or based on digital techniques (described below), to bias generator 102. Referring to FIGS. 9 and 10, bias generator may include a summing module that generates a bias voltage provided to the mass of MEMS 104, whether MEMS 104 is configured as a resonator (e.g., FIG. 10) or configured as a sensor (e.g., FIG. 11). Since target DC bias voltages applied to the mass may be greater than the power supply voltage (e.g., mass bias voltages of 3V or higher), summing module 604 may be implemented using charge pump techniques to combine the target mass bias voltage with a strain-compensating voltage.

Figure 12:
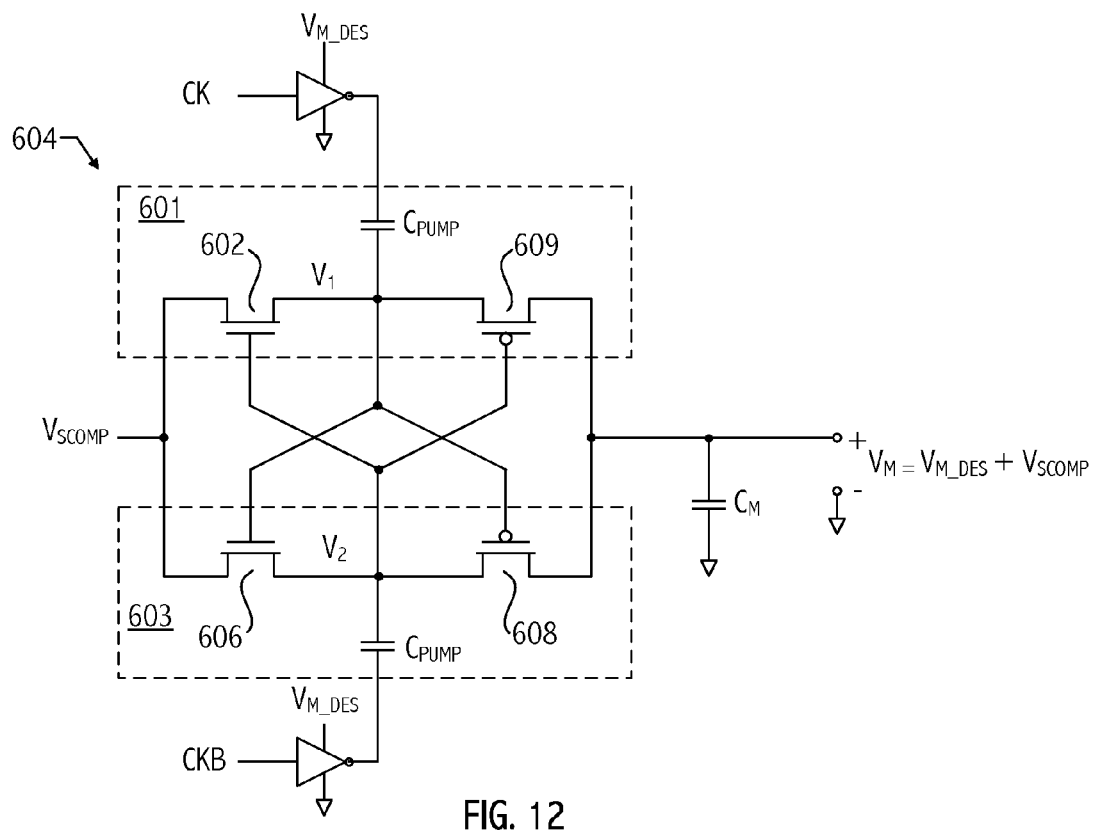
FIG. 12 illustrates a circuit diagram of an exemplary charge pump configured to generate a strain-compensating MEMS bias voltage consistent with at least one embodiment of the invention.
Figure 13:
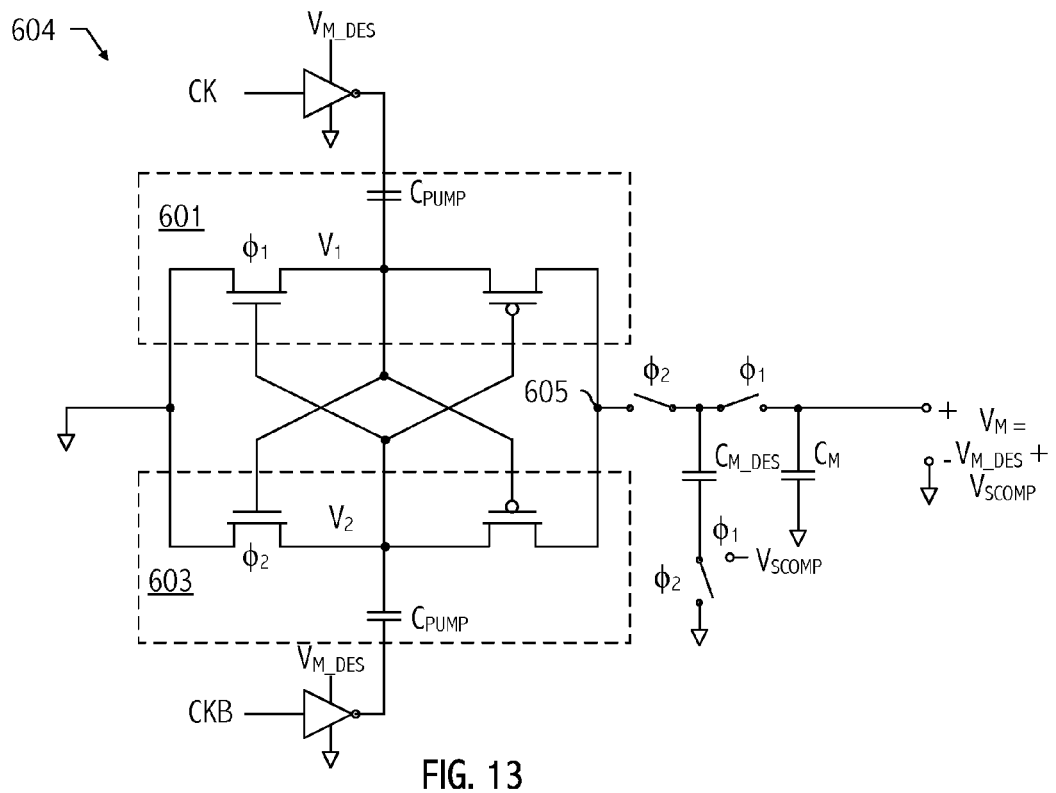
FIG. 13 illustrates a circuit diagram of an exemplary charge pump configured to generate a strain-compensating MEMS bias voltage consistent with at least one embodiment of the invention.

Referring to FIG. 12, in at least one embodiment, summing module 604 boosts the strain-compensating voltage by the target mass bias voltage level to generate the mass bias voltage. Latch-based summing module 604 boosts a control clock CK having a range of $V_{M\_DES}$ to generate level-shifted clock $V_1$, which is used to control devices 602 and 609. Similarly, latch-based summing module 604 boosts control clock CKB to generate level-shifted clock $V_2$, which is used to control devices 606, and 608. Level-shifted clocks $V_1$ and $V_2$ oscillate between the voltage levels on the input node, $V_{SCOMP}$, and the voltage level on the output node, $V_M$, where $V_M$ is a boosted version of $V_{SCOMP}$. That is, $V_M=V_{SCOMP}+V_{M\_DES}$. Summing module 604 is a double charge pump stage, i.e., it includes independent charge pump branches 601 and 603 that are coupled to the same input and output nodes. Since the two phases of the control clock signal, CK and CKB, are out-of-phase, level-shifted clocks $V_1$ and $V_2$ are also out-of-phase, resulting in branches 601 and 603 alternating pumping the output voltage level to a pumped voltage level, e.g., to a voltage level of approximately $V_{SCOMP}+V_{M\_DES}$. This implementation introduces a delay that limits the bandwidth of the MEMS compensation technique. Referring to FIG. 13, in at least one other embodiment of summing module 604, the latency associated with generating the mass bias voltage is reduced by boosting, by $V_{SCOMP}$, node 605 of the charge pump, which has already been charged to voltage $V_{M\_DES}$, by charge pump branches 601 and 603. However this technique requires use of additional output switches that may not be easily implemented from a pumped voltage supply. Note that embodiments of charge summing module 604 illustrated in FIGS. 12 and 13 are exemplary only and other techniques for generating $V_M$ may be used.

Figure 14:
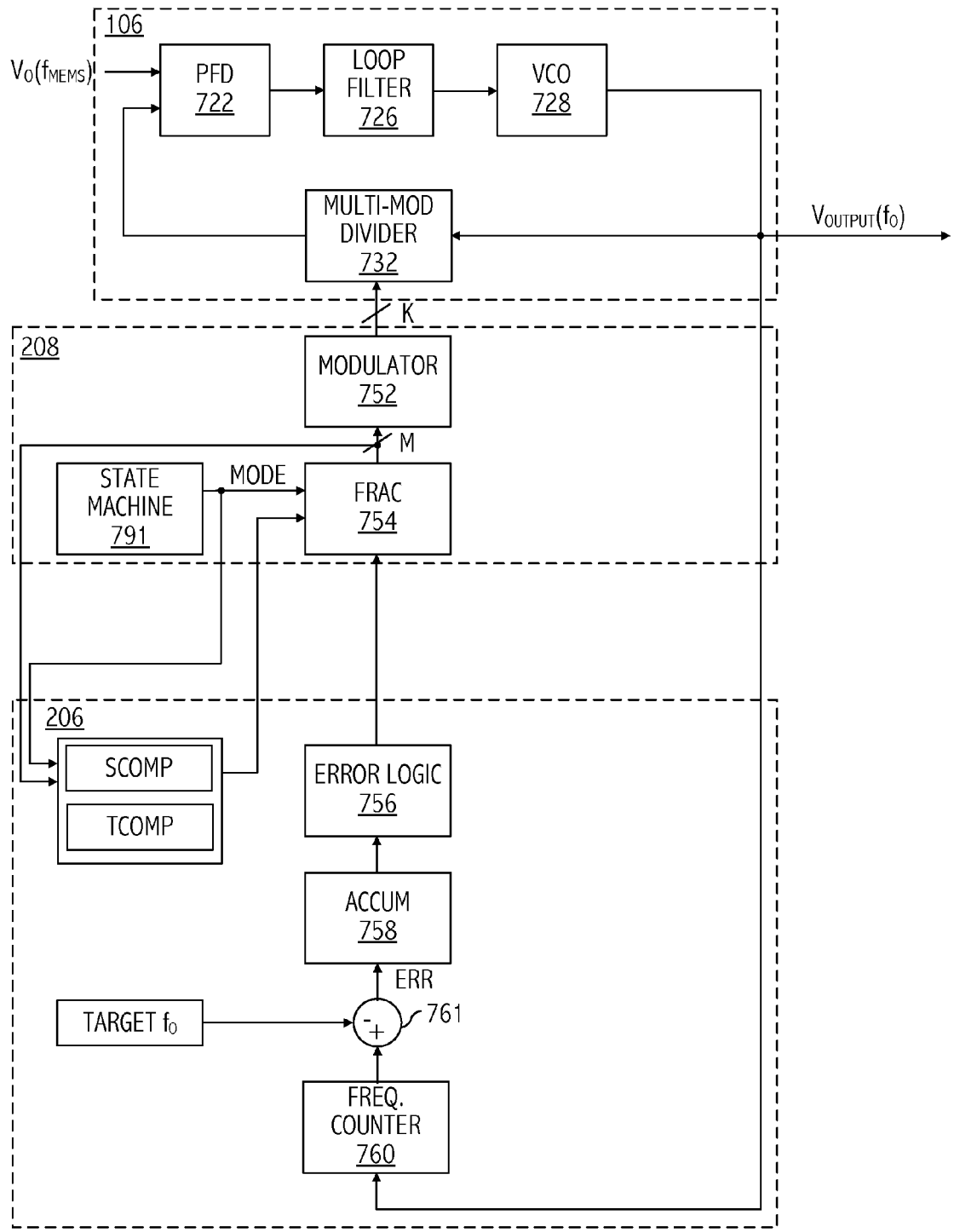
FIG. 14 illustrates a functional block diagram of an exemplary signal processing module responsive to a strain-compensation control signal of FIGS. 4 and 6 consistent with at least one embodiment of the invention.

Referring to FIG. 14, in at least one embodiment, a MEMS system uses digital techniques to detect a change in resonant frequency of MEMS device 104 configured as a resonator. Regardless of how strain sensor 206 detects the strain that causes a change in the resonant frequency, the strain indicator or change in resonant frequency may be digitized. Control module 208 provides an indication of the change in resonant frequency to a phase-locked loop (PLL) or frequency-locked loop (FLL) of signal processing module 106 to compensate for the effects of strain on the resonant frequency. The PLL or FLL of signal processing module 106 generates a reference clock signal, $V_{OUTPUT}$, having a frequency $f_{REF}$ that matches a resonant frequency of MEMS 104 based on the output of MEMS device 104. An exemplary PLL includes phase detector 722, loop filter 726, voltage-controlled oscillator (VCO) 728, and divider 732.

During the calibration mode, state machine 791 configures control module 208 to determine one or more control settings for use in the normal mode. Those control settings will be used in the normal mode to generate an output signal, $V_{OUTPUT}$, having a frequency that matches a target resonant frequency of the MEMS device, thereby compensating for effects of strain on the resonant frequency of MEMS device 104. For example, signal processing module 106 uses those control signals to lock the frequency of VCO 728 of a fractional-N phase-locked loop to generate an oscillating signal having a frequency that is the predetermined resonant frequency of the MEMS device (e.g., resonant frequency measured prior to introduction of strain on the device) or target for the resonant frequency of MEMS device 104. During the calibration mode ($t_1$), another control loop adjusts an M-bit fractional divider value that is stored in FRAC 754 and is updated until the output of VCO 728 is equal to the target resonant frequency or other predetermined resonant frequency (e.g., resonant frequency of the MEMS device when configured in characterization mode ($t_0$)). The final value in FRAC 754 is stored in SCOMP for later use in normal mode ($t_2$).

In at least one embodiment of strain sensor 206, which includes the digital logic that determines the difference in resonant frequency resulting from strain, frequency counter 760 counts event frequency of the signal generated by VCO 728. Digital circuit 761 subtracts the target event frequency from the output of frequency counter 760 and provides the difference to accumulator 758. When those event frequencies match, the output error provided to accumulator 758 is approximately zero. Otherwise a non-zero error signal indicates the frequency error, which is provided to accumulator 758. Error logic 756 uses an accumulated error signal to generate a fractional divide value that is used by the phase-locked loop to adjust the frequency of the output of VCO 728 to lock to the target resonant frequency. In at least one embodiment of the calibration mode, signal processing module 106 also implements an open-loop temperature compensation technique that determines and stores temperature coefficients. Those predetermined temperature coefficients may be applied to the fractional divider value stored in FRAC 754 or other system parameters used in the normal mode to generate the output signal having a frequency matched to the target or pre-strain resonant frequency.

At the end of the calibration mode, which is long enough for the PLL of signal processing module 106 to lock $V_{OUTPUT}$ to the target resonant frequency, one or more associated control signals are stored for later use during the normal mode of operation. For example, FRAC 754 stores an M-bit fractional divider value. During normal mode, the contents of FRAC 754 are not updated or are loaded from SCOMP and that predetermined M-bit fractional divider value is provided to delta-sigma modulator 752, which provides a stream of K-bit divide values (where K<M) to multi-modulus divider 732 to implement an effective divide value that approximates the stored fractional divider value. As a result, in normal operating mode, VCO 728 generates a signal having a frequency that achieves the target resonant frequency of MEMS device 104. Note that the digital logic of FIG. 14 is exemplary only and various other PLL and digital logic configurations for sensing a change in resonant frequency and using a PLL to compensate for the shift in resonant frequency due to strain may be used.

Figure 15:
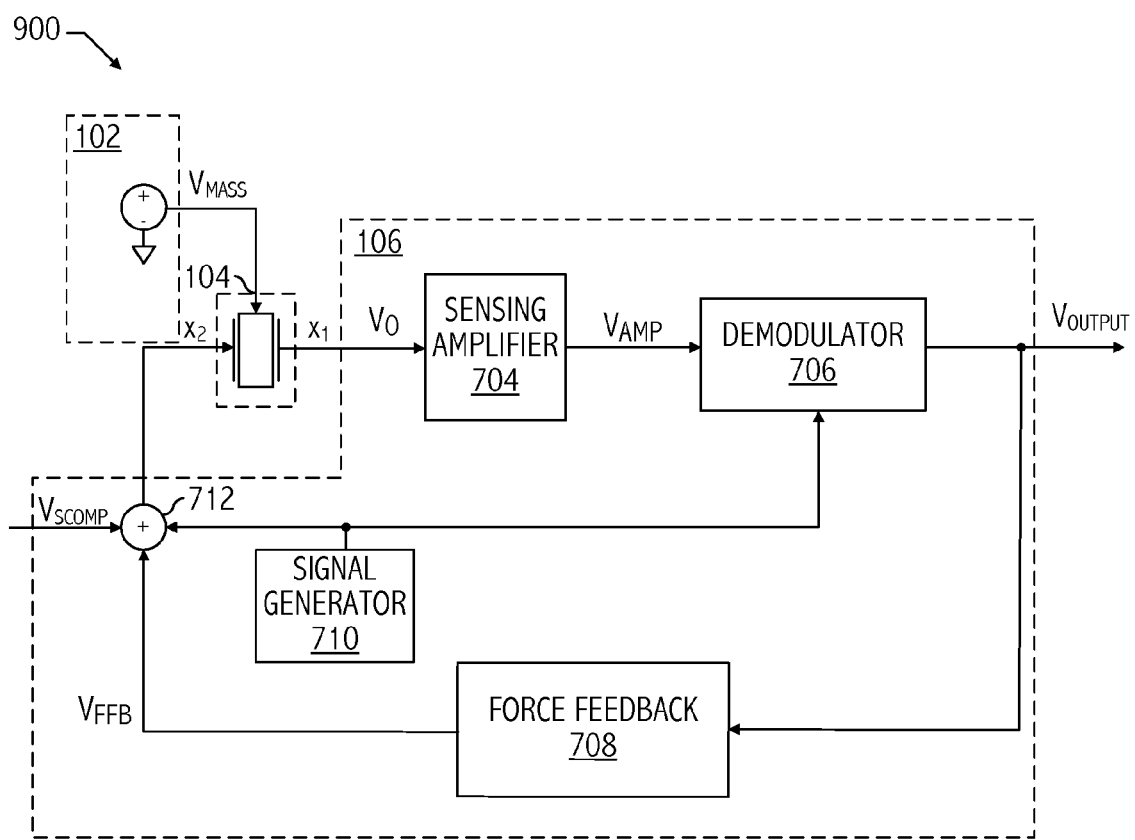
FIG. 15 illustrates a functional block diagram of an exemplary MEMS sensor responsive to a strain-compensating force feedback signal consistent with at least one embodiment of the invention.

Referring to FIG. 15, in a typical sensor application, a strain compensation signal determined using techniques described above may be applied to a summing node of a sensor implemented using a force feedback technique. The technique applies a feedback force to drive electrode $x_2$ to keep the mass at its equilibrium position (i.e., no displacement). The feedback control signal $V_{FFB}$ is generated based on sensed displacements of the mass with respect to a frame (e.g., substrate) of MEMS device 104. In at least one embodiment of force feedback module 708, the feedback control signal, $V_{FFB}$, maintains the mass of MEMS device 104 in its equilibrium position to reduce or eliminate occurrence of non-linear behavior of the mass movement as compared to a MEMS system without force feedback. Since the apparent acceleration of the mass is based on the force-feedback signal applied to the drive electrode given the DC bias applied to the mass, strain may change the apparent acceleration and sensed displacement of the MEMS device, resulting in a less accurate sensor. However, by incorporating strain sensing techniques described above into the sensor system, those inaccuracies can be reduced or eliminated. For example, the strain compensation signal $V_{SCOMP}$ is summed with a force feedback voltage level $V_{FFB}$ by summing module 712. Summing module 712 provides the summed signal to an electrode of MEMS device 104. Accordingly, the apparent acceleration of MEMS device 100 is unchanged by strain on MEMS device 104. Similarly, techniques described herein may be adapted to other MEMS systems and other applications.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. Structures described herein may be implemented using software executing on a processor (which includes firmware) or by a combination of software and hardware. Software, as described herein, may be encoded in at least one tangible computer readable medium. As referred to herein, a tangible computer-readable medium includes at least a disk, tape, or other magnetic, optical, or electronic storage medium.

The description of the invention set forth herein is illustrative, and is not intended to limit the scope of the invention as set forth in the following claims. For example, while the invention has been described in embodiments in which the MEMS device has torsional motion, one of skill in the art will appreciate that the teachings herein can be utilized with other types of MEMS devices, e.g., MEMS devices that resonate in the plane of the substrate (e.g. in an x-direction and/or a y-direction with respect to the substrate). Variations and modifications of the embodiments disclosed herein, may be made based on the description set forth herein, without departing from the scope and spirit of the invention as set forth in the following claims.

What is claimed is:

1. A method of compensating for strain on a microelectromechanical system (MEMS) device comprising: generating a signal indicative of a strain on the MEMS device in a first mode of operating a system including the MEMS device, the signal being based on a first capacitive transduction of strain-sensitive electrodes of the MEMS device sensed in the first mode of operating the system; disabling the strain-sensitive electrodes of the MEMS device in a second mode of operating the system and operating the system in the second mode using second electrodes of the MEMS device, the second electrodes being less sensitive to strain than the first electrodes; and compensating for the strain in a second mode of operating the system based on the signal.

2. The method, as recited in claim 1, wherein generating the signal comprises:
comparing an indicator of a resonant frequency of the MEMS device to a predetermined resonant frequency of the MEMS device.

3. A method of compensating for strain on a microelectromechanical system (MEMS) device comprising: generating a signal indicative of a strain on the MEMS device in a first mode of operating a system including the MEMS device in a first mode of operating a system including the MEMS device, wherein generating the signal comprises: comparing an indicator of a resonant frequency of the MEMS device to a predetermined resonant frequency of the MEMS device; determining the predetermined resonant frequency prior to attaching a substrate including the MEMS device to a second substrate; and generating the indicator of the resonant frequency after attaching the substrate including the MEMS device to the second substrate; and compensating for the strain in a second mode of operating the system based on the signal.

4. The method, as recited in claim 1, wherein generating the signal comprises:
comparing a first output of the MEMS device configured to use strain-sensitive electrodes to a second output of the MEMS device configured to use less strain-sensitive electrodes and generating an indicator thereof.

5. The method, as recited in claim 1, wherein generating the signal comprises:
comparing a first capacitance of the MEMS device formed using a substrate to a second capacitance of a second MEMS device formed using the substrate and generating the signal based thereon.

6. The method, as recited in claim 1, wherein the compensating comprises:
adjusting a bias voltage of the MEMS device based on the signal.

7. The method, as recited in claim 1, wherein the compensating comprises:
adjusting a force feedback signal of a sensor including the MEMS device based on the signal.

8. The method, as recited in claim 1, wherein the compensating comprises:
adjusting a divider value of a phase-locked loop or frequency-locked loop responsive to an output signal of an oscillator including the MEMS device based on the signal.

9. An integrated circuit comprising:
a microelectromechanical system (MEMS) device comprising: first structures configured to operate as first plates of capacitive electrodes in the first mode of operation and configured to be inoperable in the second mode of operation, a resonance mode of the MEMS device having a first strain sensitivity in the first mode of operation; and second structures configured to operate as the first plates of the capacitive electrodes coupled to the strain sensor in the second mode of operation and configured to be inoperable in the first mode of operation, the resonance mode of the MEMS device having a second strain-sensitivity in the second mode of operation, the first sensitivity being less than the second strain sensitivity; a strain sensor configured to generate a signal indicative of a strain on the MEMS device in a first mode of operation of the integrated circuit; and a control circuit configured to provide a strain-compensating signal based on the signal in a second mode of operation of the integrated circuit.

10. The integrated circuit, as recited in claim 9, further comprising:
a bias generator configured to generate the strain-compensating signal based on a target bias voltage and a compensation signal based on the signal, wherein the strain-compensating signal is a bias voltage of the MEMS device.

11. The integrated circuit, as recited in claim 9, wherein the first structures are disposed between the second structures and an axis of the MEMS device and the first structures comprise first suspended capacitive fingers anchored proximate to an anchor of a mass of the MEMS device and the second structures comprise second suspended capacitive fingers anchored distal from the anchor of the mass of the MEMS device.

12. The integrated circuit, as recited in claim 11, wherein the first capacitive fingers are interdigitated with third capacitive fingers of second plates of the capacitive electrodes and the second capacitive fingers are interdigitated with fourth capacitive fingers of the second plates of the capacitive electrodes, wherein third and fourth capacitive fingers form a portion of the body of the MEMS device disposed between respective first and second capacitive fingers.

13. The integrated circuit, as recited in claim 9, wherein the MEMS device forms a portion of a sensor circuit and the strain-compensating signal is combined with a force feedback control signal.

14. The integrated circuit, as recited in claim 9, further comprising:
    signal processing logic configured to generate an output signal based on a resonant frequency of the MEMS device,
    wherein the strain-compensating signal is provided to the signal processing logic to compensate the output signal for a change to a resonant frequency of the MEMS device based on the strain on the MEMS device.

15. The integrated circuit, as recited in claim 14, wherein the signal processing logic comprises:
    a phase-locked loop (PLL) configured to generate an output signal based on a phase difference between an output of the MEMS device, a feedback signal, and a divider value generated based on the signal.

16. The integrated circuit, as recited in claim 15, wherein in the first mode the control circuit is configured to generate the signal based on an output of a voltage-controlled oscillator of the PLL and a target resonant frequency.

17. The integrated circuit, as recited in claim 15, wherein in the second mode the control circuit is configured to generate the divider value based on the signal.

18. The integrated circuit, as recited in claim 9, wherein the strain sensor comprises:
    a storage device configured to receive a target resonant frequency of the MEMS device in a third mode,
    wherein the strain sensor is configured to generate the signal based on the target resonant frequency in the first mode.

* * * * *